United States Patent [19]

Vickers

[11] Patent Number: 5,633,120
[45] Date of Patent: May 27, 1997

[54] METHOD FOR ACHIEVING ANODE STRIPE DELINEATION FROM AN INTERLEVEL DIELECTRIC ETCH IN A FIELD EMISSION DEVICE

[75] Inventor: Kenneth G. Vickers, Whitesboro, Tex.

[73] Assignee: Texas Instruments Inc., Dallas, Tex.

[21] Appl. No.: 445,614

[22] Filed: May 22, 1995

[51] Int. Cl.$^6$ .................................................. G03F 7/00
[52] U.S. Cl. ........................ 430/313; 430/318; 430/319; 216/25
[58] Field of Search .......................... 430/311, 313, 430/314, 315, 317, 318, 319, 320, 323, 324, 329, 396, 20; 216/13; 15/625.1

[56] References Cited

U.S. PATENT DOCUMENTS

| | | | |
|---|---|---|---|
| 3,755,704 | 8/1973 | Spindt et al. | 313/309 |
| 4,857,799 | 8/1989 | Spindt et al. | 313/495 |
| 4,940,916 | 7/1990 | Borel et al. | 313/306 |
| 5,194,780 | 3/1993 | Meyer | 315/169.3 |
| 5,225,820 | 7/1993 | Clerc | 340/752 |
| 5,491,376 | 2/1996 | Levine | 313/495 |

*Primary Examiner*—Kathleen Duda
*Attorney, Agent, or Firm*—Rose Alyssa Keagy; Richard L. Donaldson

[57] ABSTRACT

A method of fabricating a double level metal (DLM) anode plate for use in a field emission device comprises the steps of providing a transparent substrate 82 having an active region 58 and a bus region 62. Then providing electrically conductive regions 50 on the surface. The conductive regions 50 span the active region 58 and the bus region 62. Next, the surface is coated with an electrically insulating material 94 and then the electrically insulating material 94 is removed from selected portions of the bus region 62, the active region 58, and upper portions of the transparent substrate 82. A first bus 52 is provided for electrically connecting a first series of the conductive regions, a second bus 54 is provided for electrically connecting a second series of the conductive regions, and a third bus 56 is provided for electrically connecting a third series of the conductive regions. Luminescent material of a first color 88$_R$ is applied to the first series of conductive regions 50$_R$, luminescent material of a second color 88$_G$ is applied to the second series of conductive regions 50$_G$, and luminescent material of a third color 88$_B$ is applied to the third series of conductive regions 50$_B$.

7 Claims, 4 Drawing Sheets

METHOD FOR ACHIEVING ANODE STRIPE DELINEATION FROM AN INTERLEVEL DIELECTRIC ETCH IN A FIELD EMISSION DEVICE

RELATED APPLICATION

This application includes subject matter which is related to U.S. patent application Ser. No. 08/247,951, "Flat Panel Display Anode Plate Having Isolation Grooves," assigned to Texas Instruments, Docket No. TI-18685, filed Jun. 3, 1994.

TECHNICAL FIELD OF THE INVENTION

The present invention relates generally to flat panel displays and, more particularly, to a method of fabricating an anode plate for use in a flat panel display.

BACKGROUND OF THE INVENTION

The phenomenon of field emission was discovered in the 1950's, and extensive research by many individuals, such as Charles A. Spindt of SRI International, has improved the technology to the extent that its use in the manufacture of inexpensive, low-power, high-resolution, high-contrast, full-color flat displays is possible. Advances in field emission display technology are disclosed in U.S. Pat. No. 3,755,704, "Field Emission Cathode Structures and Devices Utilizing Such Structures," issued 28 Aug. 1973, to C. A. Spindt et al.; U.S. Pat. No. 4,940,916, "Electron Source with Micropoint Emissive Cathodes and Display Means by Cathodoluminescence Excited by Field Emission Using Said Source," issued 10 Jul. 1990 to Michel Borel et al.; U.S. Pat. No. 5,194,780, "Electron Source with Microtip Emissive Cathodes," issued 16 Mar. 1993 to Robert Meyer; and U.S. Pat. No. 5,225,820, "Microtip Trichromatic Fluorescent Screen," issued 6 Jul. 1993, to Jean-Frédéric Clerc. These patents are incorporated by reference into the present application.

A FED flat panel display arrangement is disclosed in U.S. Pat. No. 4,857,799, "Matrix-Addressed Flat Panel Display," issued Aug. 15, 1989, to Charles A. Spindt et al., incorporated herein by reference. This arrangement includes a matrix array of individually addressable light generating means of the cathodoluminescent type having electron emitting cathodes combined with an anode which is a luminescing means which reacts to electron bombardment by emitting visible light. Each cathode is itself an array of thin film field emission cathodes on a backing plate, and the luminescing means is provided as a phosphor coating on a transparent face plate which is closely spaced to the cathodes.

The emitter backing plate disclosed in the Spindt et al. ('799) patent includes a large number of vertical conductive cathode electrodes which are mutually parallel and extend across the backing plate and are individually addressable. Each backing plate includes a multiplicity of spaced-apart electron emitting tips which project upwardly from the vertical cathode electrodes on the backing plate and therefore extend perpendicularly away from the backing plate. An electrically conductive gate electrode arrangement is positioned adjacent to the tips to generate and control the electron emission. The gate electrode arrangement comprises a large number of individually addressable, horizontal electrode stripes which are mutually parallel and extend along the backing plate orthogonal to the cathode electrodes, and which include apertures through which emitted electrons may pass. Each gate electrode is common to a full row of pixels extending across the front face of the backing plate and is electrically isolated from the arrangement of cathode electrodes. The emitter back plate and the anode face plate are parallel and spaced apart.

The anode is a thin film of an electrically conductive transparent material, such as indium tin oxide (ITO), which covers the interior surface of the anode face plate. Deposited onto this metal layer is a luminescent material, such as phosphor, that emits light when bombarded by electrons.

The array of emitting tips on the backing plate is activated by addressing the orthogonally related cathode gate electrodes in a generally conventional matrix-addressing scheme. The appropriate cathode electrodes of the display along a selected stripe, such as along one column, are energized while the remaining cathode electrodes are not energized. Gate electrodes of a selected stripe orthogonal to the selected cathode electrode are also energized while the remaining gate electrodes are not energized, with the result that the emitting tips of a pixel at the intersection of the selected cathode and gate electrodes will be simultaneously energized, emitting electrons so as to provide the desired pixel display.

The Spindt et al. patent teaches that it is preferable that an entire row of pixels be simultaneously energized, rather than energization of individual pixels. According to this scheme, sequential lines are energized to provide a display frame, as opposed to sequential energization of individual pixels in a raster scan manner.

The Clerc ('820) patent discloses a trichromatic field emission flat panel display having a first substrate comprising the cathode and gate electrodes, and having a second substrate facing the first, including regularly spaced, parallel conductive stripes comprising the anode electrode. These stripes are alternately covered by a first material luminescing in the red, a second material luminescing in the green, and a third material luminescing in the blue, the conductive stripes covered by the same luminescent material being electrically interconnected.

Today, a conventional FED is manufactured by combining the teachings of many practitioners, including the teachings of the Spindt et al. ('799) and Clerc ('820) patents. Referring initially to FIG. 1, there is shown, in cross-sectional view, a portion of an illustrative prior field emission device. This device comprises an anode plate 1 having an electroluminescent phosphor coating 3 facing an emitter plate 2, the phosphor coating 3 being observed from the side opposite to its excitation.

More specifically, the field emission device of FIG. 1 comprises a cathodoluminescent anode plate 1 and an electron emitter (or cathode) plate 2. A cathode portion of emitter plate 2 includes conductors 9 formed on an insulating substrate 10, an electrically resistive layer 8 which is formed on substrate 10 and overlaying the conductors 9, and a multiplicity of electrically conductive microtips 5 formed on the resistive layer 8. In this example, the conductors 9 comprise a mesh structure, and microtip emitters 5 are configured as a matrix within the mesh spacings. Microtips 5 take the shape of cones which are formed within apertures through conductive layer 6 and insulating layer 7.

A gate electrode comprises the layer of the electrically conductive material 6 which is deposited on the insulating layer 7. The thicknesses of gate electrode layer 6 and insulating layer 7 are chosen in such a way that the apex of each microtip 5 is substantially level with the electrically conductive gate electrode layer 6. Conductive layer 6 may be in the form of a continuous layer across the surface of substrate 10; alternatively, it may comprise conductive bands across the surface of substrate 10.

Anode plate 1 comprises a transparent, electrically conductive film 12 deposited on a transparent planar support 13, such as glass, which is positioned facing gate electrode 6 and parallel thereto, the conductive film 12 being deposited on the surface of the glass support 13 directly facing gate electrode 6. Conductive film 12 may be in the form of a continuous layer across the surface of the glass support 13; alternatively, it may be in the form of electrically isolated stripes comprising three series of parallel conductive bands across the surface of the glass support 13, as shown in FIG. 1 and as taught in U.S. Pat. No. 5,225,820, to Clerc. By way of example, a suitable material for use as conductive film 12 may be indium-tin-oxide (ITO), which is optically transparent and electrically conductive. Anode plate 1 also comprises a cathodoluminescent phosphor coating 3, deposited over conductive film 12 so as to be directly facing and immediately adjacent gate electrode 6. In the Clerc patent, the conductive bands of each series are covered with a particulate phosphor coating which luminesces in one of the three primary colors, red, blue and green $3_R$, $3_B$, $3_G$.

Selected groupings of microtip emitters 5 of the above-described structure are energized by applying a negative potential to cathode electrode 9 relative to the gate electrode 6, via voltage supply 19, thereby inducing an electric field which draws electrons from the apexes of microtips 5. The potential between cathode electrode 9 and gate electrode 6 is approximately 70–100 volts. The freed electrons are accelerated toward the anode plate 1 which is positively biased by the application of a substantially larger positive voltage from voltage supply 11 coupled between the cathode electrode 9 and conductive film 12 functioning as the anode electrode. The potential between cathode electrode 9 and anode electrode 12 is approximately 300–800 volts. Energy from the electrons attracted to the anode conductive film 12 is transferred to particles of the phosphor coating 3, resulting in luminescence. The electron charge is transferred from phosphor coating 3 to conductive film 12, completing the electrical circuit to voltage supply 11. The image created by the phosphor stripes 3 is observed from the anode side which is opposite to the phosphor excitation, as indicated in FIG. 1.

It is to be noted and understood that true scaling information is not intended to be conveyed by the relative sizes and positioning of the elements of anode plate 1 and the elements of emitter plate 2 as depicted in FIG. 1. For example, in a typical FED shown in FIG. 1 there are approximately one hundred arrays 4, of microtips per display pixel, and there are three color stripes $3_R$, $3_B$, $3_G$ per display pixel.

The process of producing each frame of a display using a typical trichromatic field emission display includes (1) applying an accelerating potential to the red anode stripes while sequentially addressing the gate electrodes (row lines) with the corresponding red video data for that frame applied to the cathode electrodes (column lines); (2) switching the accelerating potential to the green anode stripes while sequentially addressing the rows lines for a second time with the corresponding green video data for that frame applied to the column lines; and (3) switching the accelerating potential to the blue anode stripes while sequentially addressing the row lines for a third time with the corresponding blue video data for that frame applied to the column lines. This process is repeated for each display frame.

All red stripes $3_R$ of the anode plate 1 are electrically coupled together. All green stripes $3_G$ and all blue stripes $3_B$ are also electrically coupled to each other. The prior art structure used to facilitate the electrical interconnection of the color anode stripes $3_R$, $3_G$, and $3_B$, is shown in FIGS. 2 and 3. FIG. 2 shows the manner in which the conductive film 34 of the anode stripes are interconnected in the prior art. The conductive films 34 are substantially similar to the conductive film 12 of FIG. 1. Conductive film $34_R$ is covered with a phosphor coating luminescing in red, conductive film $34_B$ is covered with a phosphor coating luminescing in blue, and conductive film $34_G$ is covered with a phosphor coating luminescing in green.

The conductive films $34_R$ are electrically interconnected by a first conductive band 36. The conductive films $34_G$ are electrically interconnected by a second conductive band 38. The conductive films $34_B$ are electrically interconnected by a anisotropic conductive ribbon 40 described more fully below. The first and second conductive bands 36, 38 are formed on the anode plate 1 at the same time the conductive films 34 are formed. The conductive bands 36, 38 and the conductive films 34 are also coplanar and both are comprised of the same conductive material, illustratively indium-tin-oxide (ITO).

The conductive films $34_R$ which are connected to band 36 are interdigitated with the conductive films $34_G$ which are connected to band 38 and the conductive films $34_B$ which are connected to band 40. The anisotropic conductive ribbon 40 is deposited perpendicular to the conductive films 34.

FIG. 3 shows a section of the anode plate 1 along the anisotropic conductive ribbon 40, as indicated in FIG. 2. The anisotropic ribbon 40 is essentially formed by a conductive strip 40" and a film 40'. The film 40' comprises carbide balls 42 distributed in an insulating binder forming the film 40', so as not to conduct electricity. As can be seen from FIG. 3, the conductive strip 40" crushes the film 40' at the conductive films $34_B$. The density of the balls 42 is such that at the crushed points the balls 42 are in contact and the ribbon 40 becomes conductive at these points. Thus, the conductive films $34_B$ are electrically connected to the conductive ribbon 40", but the non-crushed locations of film 40' are insulating.

There are numerous disadvantages to the prior art structure used to interconnect the red, green, and blue anode stripes. First, the use of the externally attached anisotropic ribbon 40 to connect the conductive films $34_B$ creates a significant FED system reliability problem. If the ribbon 40 isn't assembled to anode plate 1 properly then the conductive films 34 of two or three colors will be shorted together. Furthermore, the ribbon 40 can become disconnected from the conductive films $34_B$, causing lines to appear in the display image at the places where the conductive films $34_B$ are not electrically interconnected to the ribbon 40.

Two additional shortcomings of field emission displays of the prior art are the low contrast ratio of the display and the low emission intensity of the low voltage phosphors typically used as the luminescent material on the display screen. Referring briefly to FIG. 1, the low contrast ratio is due in part to phosphors which collect on the substrate 13 alongside the edges of the ITO anode stripes 12. This build-up of phosphors causes the delineation between the anode stripes to blur, thereby decreasing the clarity of the display image.

The low emission intensity of the phosphor has several origins, one of which is the low acceleration voltage used to excite the free electrons toward the anode. Currently, this acceleration voltage is limited by the potential which can be placed on the transparent stripe anode conductors underlaying the phosphor stripes, typically at about 300 volts. It is known that significantly improved performance would be provided by increasing the anode potential to about 1000 volts. However, as the acceleration voltage is increased, the leakage current between the conductive anode stripes also increases, eventually leading to breakdown when the leakage current becomes excessive. The sources of this leakage current between adjacent anode stripes include residual interstitial traces of anode conductor material which are not completely removed during the fabrication of the stripes, field emission from the stripe edges which are sharpened during fabrication, and the smooth glass surface of the substrate itself.

In view of the above, it is clear that there exists a need for a method of fabricating a more reliable bus structure. It is also clear that there exists a need for a method for fabricating an improved anode plate of a field emission flat panel display device which facilitates improved electrical and optical anode stripe delineation.

SUMMARY OF THE INVENTION

In accordance with the principles of the present invention, there is disclosed herein a method of fabricating an anode plate for use in a field emission device. The method comprises the steps of providing a transparent substrate having an active region and a bus region on a surface thereof, and providing spaced-apart, electrically conductive regions on the surface. The conductive regions span the active region and the bus region. Next, the surface is coated with an electrically insulating material and then the electrically insulating material is removed from selected portions of the bus region and the active region Selected regions of the upper portions of the transparent substrate are also removed. A first bus is provided for electrically connecting a first series of the conductive regions, a second bus is provided for electrically connecting a second series of the conductive regions, and a third bus is provided for electrically connecting a third series of the conductive regions. Luminescent material of a first color is applied to the first series of conductive regions, luminescent material of a second color is applied to the second series of conductive regions, and luminescent material of a third color is applied to the third series of conductive regions.

The use of Double Level Metal (DLM) technology, as disclosed herein improves the anode plate reliability by eliminating the use of the mechanically attached external bus strip. Furthermore, it is a technical advantage to etch the grooves along with the interlevel dielectric (ILD) insulator. Without adding steps to the DLM manufacturing process, the grooves are formed between the anode stripes, and thereby improves the optical anode stripe delineation by improving the definition of the phosphor depositions. The grooves also increase the electrical isolation of the stripe conductors from one another, thereby permitting the use of higher anode potentials without the risk of voltage breakdown. Hence, for the application to flat panel display devices envisioned herein, the methods in accordance with the present invention provide significant advantages.

BRIEF DESCRIPTION OF THE DRAWING

The foregoing features of the present invention may be more fully understood from the following detailed description, read in conjunction with the accompanying drawings, wherein:

FIG. 1 is a cross-sectional view of a portion of a field emission device according to the prior art.

DETAILED DESCRIPTION

Figure 4:
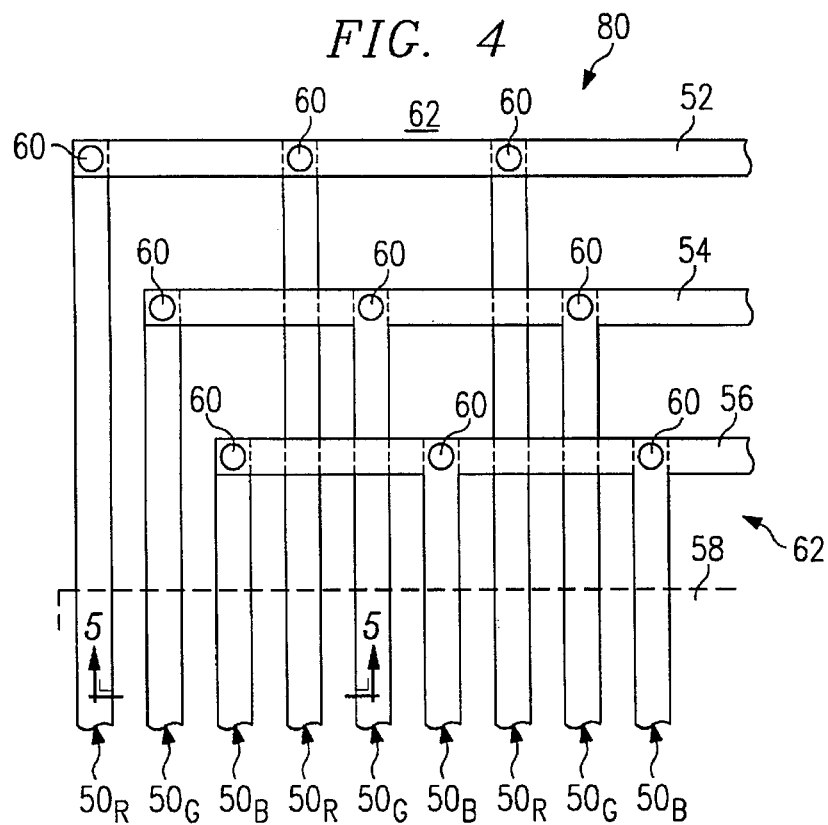
FIG. 4 is a top view of an arrangement of the conductive stripes and buses of the anode plate using double level metal techniques in accordance with the present invention.

One technique for improving the reliability of the anode plate is to eliminate the use of the externally attached ribbon. This may be accomplished by designing the anode plate using Double Level Metal (DLM) techniques. FIG. 4 is a top view of an arrangement of the conductive stripes and buses of the anode plate using double level metal techniques. As shown in FIG. 4, all red anode stripes $50_R$ are electrically interconnected to the red color bus 52, all green anode stripes $50_G$ are electrically interconnected to the green color bus 54, and all blue anode stripes $50_B$ are electrically interconnected to the blue color bus 56.

The anode plate of the present invention is designed such that the conductors 50 do not extend beyond their respective buses. The purpose of this design is to minimize the number of regions in the anode plate DLM bus structure where a bus of one color must cross an anode stripe of another color. For example, red bus 52 does not cross any green or blue anode stripes $50_G$ or $50_B$, and green bus 54 only crosses the red anode stripes $50_R$.

In the structure shown in FIG. 4 anode stripes 50 may be illustratively 80 microns wide and spaced from one another by 30 microns. Since this application uses 80 microns wide anode stripes, a layout engineer would typically make the width of the buses 52, 54, 56 80 microns wide also. This bus width would be chosen because it would be easy to design and because it easily accommodates the current and voltage drop requirements of the anode plate design. Furthermore, a bus width of 80 microns would be selected because the layout engineer would not want to make the bus width smaller than the anode stripe width and thereby unnecessarily restrict the diameter of the via 60. The buses 52, 54, and 56 are illustratively spaced 80 microns from one another. Of course, other bus widths and spacing may be utilized according to design needs.

The region in which the charged electrons from the cathode plate travel to the anode stripes, thereby energizing the color phosphors and creating the color display image, is called the active, or image-forming, region 58. The buses 52, 54, and 56, as well as the interconnections between the buses and the anode stripes 50 are located in the bus region 62 outside the active region 58.

The anode stripes 50 are interconnected to the buses 52, 54, and 56 through vias 60 using the DLM structure shown in FIG. 4. The vias 60 illustratively have a diameter of 50 microns. Because every red, green, and blue anode stripe $50_R$, $50_G$, $50_B$ is connected to its respective red, green and blue bus 52, 54, 56, FIG. 4 illustrates only a representative portion of the total anode plate structure.

Figure 5:
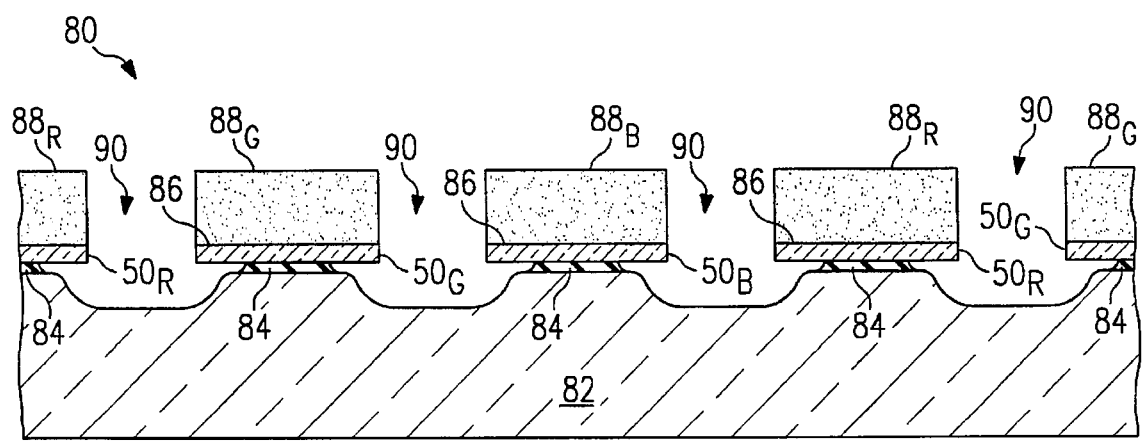
FIG. 5 is a cross-sectional view of an anode stripe region of the anode plate in accordance with the present invention.
Figure 6:
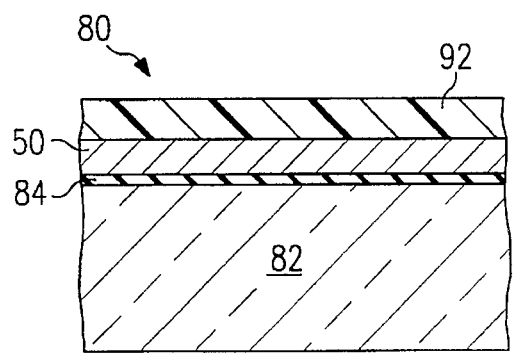
Figure 7:
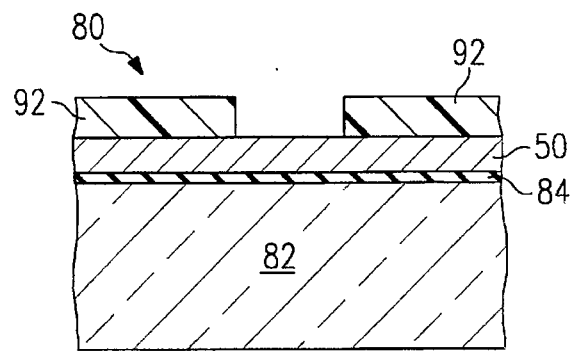
Figure 8:
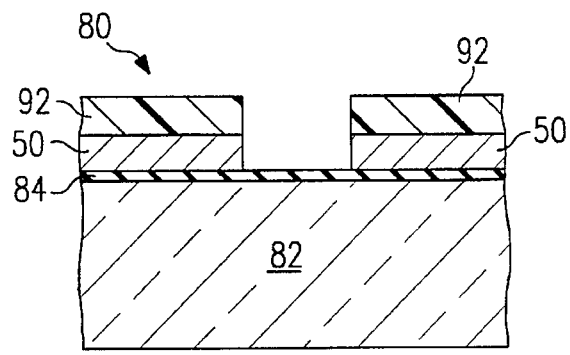
Figure 9:
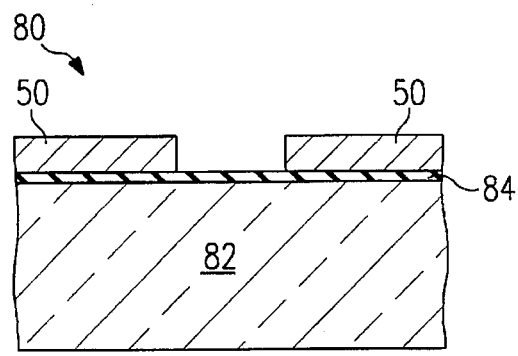
Figure 10:
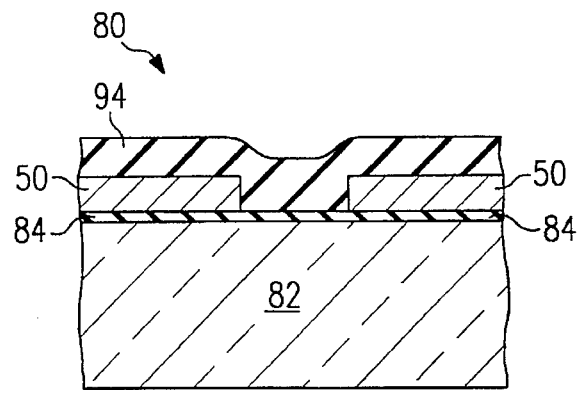

Referring now to FIG. 5, there is shown a cross-sectional view across multiple anode stripes in the active region 58 of anode plate 80, as indicated in FIG. 4. Anode plate 80 comprises a transparent planar substrate 82 having a layer 84 of an insulating material, illustratively silicon dioxide ($SiO_2$). A plurality of electrically conductive anode stripes 50 are located above insulating layer 84. The conductive regions $50_R$, $50_G$, $50_B$, which are referred to collectively as conductors 50, comprise the anode electrode of the field emission flat panel display device of the present invention. Luminescent material $88_R$, $88_G$ and $88_B$, referred to collectively as luminescent material 88, overlays conductors 50, thereby forming substantially parallel phosphor stripes.

Multiple isolation grooves 90 are formed in the upper surface of substrate 82 at the interstices of conductors 50. The grooves 90 enhance the electrical isolation between adjacent conductors 50. In addition, grooves 90 enhance optical delineation between the phosphor stripes 88 because the grooves 90 prevent excess build-up of phosphor material along the sides of the anode stripe conductors 50.

In the present example, transparent substrate 82 comprises glass. Also in this example, conductive regions 50 comprise a plurality of parallel anode stripe conductors which extend normal to the plane of the drawing sheet. A suitable material for use as anode stripe conductors 50 may be indium-tin-oxide (ITO), which is optically transparent and electrically conductive. In this example, luminescent material 88 comprises a particulate phosphor coating which luminesces in one of the three primary colors, red $88_R$, green $88_G$ and blue $88_B$. A preferred process for applying phosphor coatings 88 to stripe conductors 50 comprises electrophoretic deposition. For purposes of this disclosure, as well as in the claims which follow, the term "transparent" shall refer to a high degree of optical transmissivity in the visible range (the region of the electromagnetic spectrum approximately between 4,000–8,000Å).

No true scaling information is intended to be conveyed by the relative sizes of the elements of FIG. 5. By way of illustration, stripe conductors 50 may be 80 microns in width, and spaced from one another by 30 microns. The thickness of conductors 50 may be approximately 1,500Å, and the thickness of phosphor coatings 88 may be approximately 150,000Å. The substrate 82 is approximately 100,000Å thick and the depth of grooves 90 is illustratively 15,000Å. Though the illustrative overetch is 100%, grooves 90 of lesser and greater depths are within the scope of this invention.

Figure 6:
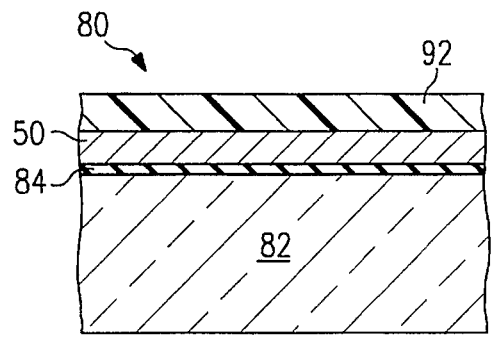
FIGS. 6 through 10 illustrate steps in a process for fabricating the anode plate of FIG. 5 in accordance with the present invention.
Figure 7:
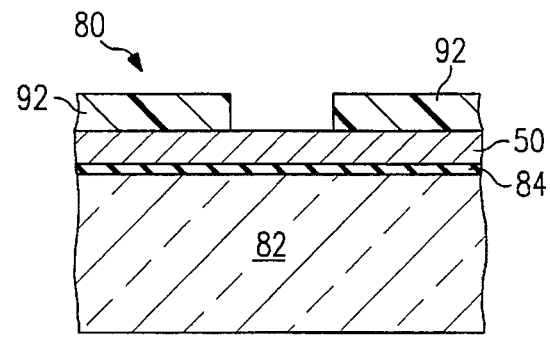
Figure 8:
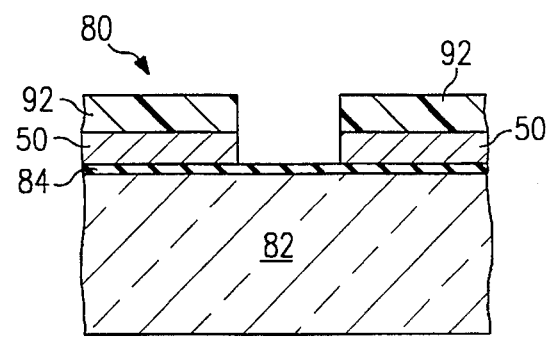

A typical method for manufacturing the anode plate using the DLM process is as follows. Referring initially to FIG. 6, the glass substrate 82 is purchased with an $SiO_2$ insulating layer 84 which is 500Å thick and a layer of ITO 50 which is 1,500Å thick. A layer of photoresist 92, illustratively type AZ-1350J sold by Hoescht-Celanese of Somerville, N.J., is spun on over the ITO layer 50 to a thickness of approximately 10,000Å. Next, a patterned mask (not shown) is disposed over the light-sensitive photoresist layer. The mask exposes desired regions of the photoresist to light. The mask used in this step defines anode stripes 50 which have a width of approximately 80μ. The exposed regions are removed during the developing step, which may consist of soaking the assembly in a caustic or basic chemical such as Hoescht-Celanese AZ developer. The developer removes the unwanted photoresist regions which were exposed to light, as shown in FIG. 7. The exposed regions of the ITO layer are then removed, typically by a reactive ion etch (RIE) process using carbon tetraflouride ($CF_4$), leaving the structure shown in FIG. 8. Although not shown as part of this process, it may also be desired to remove $SiO_2$ layer 84 underlying the etched-away regions of the ITO layer 50.

Figure 9:
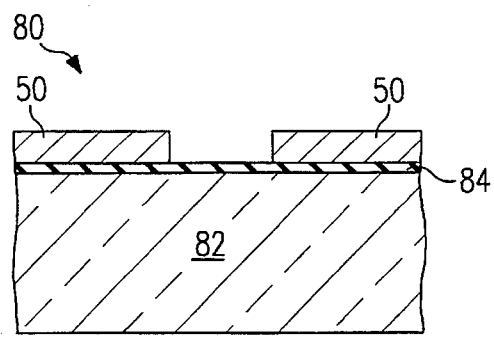

The remaining photoresist layer is removed by a wet strip process using commercial organic strippers or plasma ashing, leaving the structure shown in FIG. 9. The portions of ITO which now remain on substrate 82 are anode stripes 50.

Figure 10:
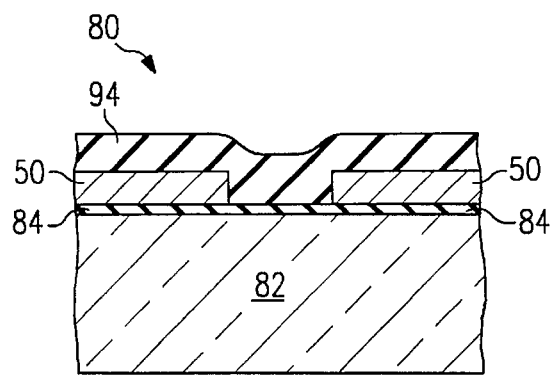
Figure 2:
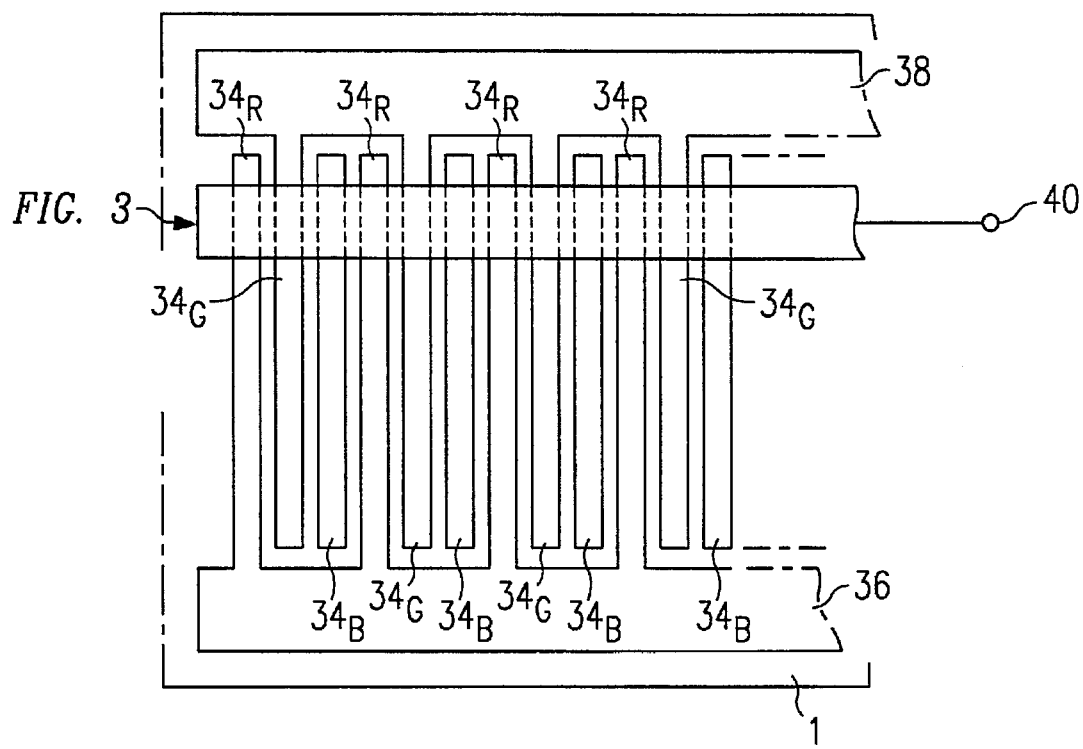
FIG. 2 is a top view of the arrangement of conductive bands according to the prior art.
Figure 3:
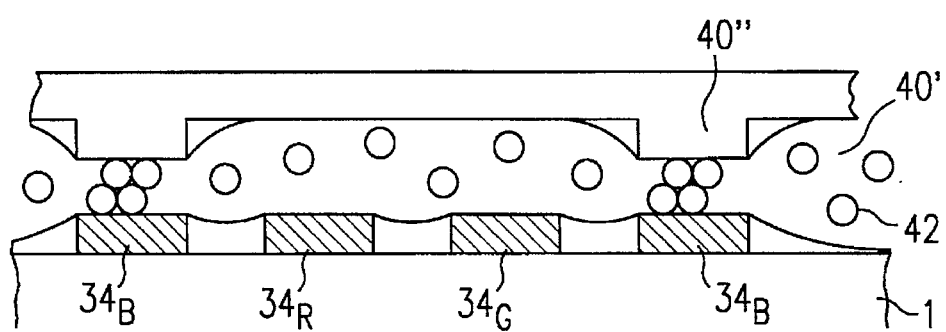
FIG. 3 is a cross-sectional view of a conductive band of FIG. 2 according to the prior art.

An insulating layer 94 of Plasma Enhanced Chemical Vapor Deposition oxide (PECVD) now is applied over the entire anode plate to a thickness of 15,000Å, as shown in FIG. 10. Alternatively, the insulator layer 94 could be amorphous silicon dioxide or other types of insulating films which is deposited by a chemical vapor deposition (CVD) process. This insulating layer is also called the interlevel dielectric layer (ILD). A layer of photoresist is again applied and a mask defining an active region 58, and 50μ diameter vias 60 (both shown in FIG. 4) is added. Then the exposed photoresist is developed. The unwanted photoresist regions which are exposed to light are removed by soaking the assembly in a caustic or basic chemical, such as Hoescht-Celanese AZ developer.

Next, the anode plate is over-etched to remove both the exposed regions of ILD 94 and the upper portion of the substrate 82 underlying the etched ILD 94. The remaining photoresist layer is now removed by a wet strip process using commercial organic strippers or plasma ashing. The ILD 94 and the upper portions of substrate 82 are removed by either plasma etch ($CF_4$ or other fluorocarbons), or by a wet process using HF. According to the present invention, the normal plasma etch time of 3 minutes (needed to remove the 15,000Å ILD layer 94) is doubled to 6 minutes in order to etch the single undercut groove 90 between each anode stripe 50 to a depth of 15,000Å. Since the depth of the groove 90 is determined by the length of the etch, the etch time may be varied to increase or decrease the groove 90 depth. The process of etching grooves 90 will also cause some etching of insulating material 84 below the edges of ITO stripe 50. FIG. 5 illustrates the single groove 90 structure of the present invention.

According to the present invention, an isotropic plasma etch is used to remove the ILD and form the grooves because vias 60 should have sloped sidewalls to facilitate a robust electrical connection between the anode stripes 50 and the bus conductors 52, 54, and 56. The use of a plasma etch which is selective to ITO (such as $CF_4$) is necessary in order to use the ITO stripes 50 as the mask for creating the grooves 90. The photoresist now remaining is removed using plasma ash.

The next step in the fabrication process of the anode structure is to create the buses and deposit the phosphor coating 84. These final steps are summarized below but described in more detail in co-assigned and co-pending U.S. patent application Ser. No. 08/402,596 "Reduction of the Probability of Interlevel Oxide Failures By Minimization of Lead Overlap Area Through Bus Width Reduction," assigned to Texas Instruments, Docket No. 20384, filed Mar. 13, 1995, and incorporated herein by reference.

The bus conductors 52, 54, and 56 (shown in FIG. 4) are formed by first depositing a second conductive layer of Al:2% Cu over the entire anode plate to a thickness of approximately 10,000Å. A layer of photoresist is spun over the AlCu layer and a patterned mask defining buses 52, 54, 56 is then disposed over the light-sensitive photoresist layer.

Next, the developing step removes the unwanted photoresist regions which were exposed to light. The exposed regions of the AlCu are then removed, typically using either plasma or wet chlorine chemistries, which do not harm the previously deposited metal ITO layer.

The AlCu bus layers 52, 54, and 56 are now electrically interconnected to anode stripes $50_R$, $50_G$, and $50_B$ respectively in the via region 60 as a result of the DLM process described. The remaining photoresist layer is removed by a wet strip process using commercial organic strippers or plasma ashing. The completed DLM structure is shown in FIG. 4. The final step in the fabrication process of the anode structure is to provide the cathodoluminescent phosphor coatings 84, which are deposited over conductive ITO regions 50, typically by electrophoretic deposition.

Several other variations in the above processes, such as would be understood by one skilled in the art to which it pertains, are considered to be within the scope of the present invention. As a first such variation, it will be understood that a hard mask, such as aluminum or gold, may replace photoresist layer 92 of the above process. In addition, while the disclosure describes a manufacturing process using positive photoresist, a manufacturing process employing negative photoresist is also comprehended. Furthermore, while the disclosure describes forming the PECVD 94 with one layer, the PECVD 94 may be applied in two or more consecutive thin layers which together create a total thickness of 15,000Å. Alternative methods of ILD deposition, such as single or multiple layers of spin-on glass (SOG) may also be used. Finally, while the disclosure describes etching grooves 90 to a depth of 15,000Å, grooves of different depths are comprehended by the present invention.

The use of DLM technology, as disclosed herein improves the anode plate reliability by eliminating the use of the mechanically attached external bus strip. Furthermore, it is a technical advantage to etch the grooves 90 along with the ILD insulator 92. Without adding steps to the DLM manufacturing process, grooves 90 are formed between the anode stripes 50, and thereby improves the optical anode stripe delineation by improving the definition of the phosphor depositions. The grooves 90 also increase the electrical isolation of the stripe conductors from one another, thereby permitting the use of higher anode potentials without the risk of voltage breakdown. Hence, for the application to flat panel display devices envisioned herein, the methods in accordance with the present invention provide significant advantages.

While the principles of the present invention have been demonstrated with particular regard to the structures and methods disclosed herein, it will be recognized that various departures may be undertaken in the practice of the invention. The scope of the invention is not intended to be limited to the particular structures and methods disclosed herein, but should instead be gauged by the breadth of the claims which follow.

What is claimed is:

1. A method of fabricating an anode plate for use in a field emission device, said method comprising the steps of:

providing a transparent substrate having an active region and a bus region on a surface thereof;

providing spaced-apart, electrically conductive regions on said surface thereof, said conductive regions spanning said active region and said bus region;

coating said surface with an electrically insulating material;

removing said electrically insulating material from selected portions of said bus region and from said active region, and also removing portions of said transparent substrate in said active region in spaces between said electrically conductive regions;

depositing a conductive layer and forming therefrom a first bus in said bus region electrically connected to a first series of said conductive regions, a second bus in said bus region electrically connected to a second series of said conductive regions, and a third bus in said bus region electrically connected to a third series of said conductive regions;

applying luminescent material of a first color on said first series of conductive regions in said active region;

applying luminescent material of a second color on said second series of conductive regions in said active region; and applying luminescent material of a third color on said third series of conductive regions in said active region.

2. The method in accordance with claim 1 wherein said step of providing electrically conductive regions comprises the sub-steps of:

depositing a layer of a transparent, electrically conductive material on said surface of said substrate;

coating said surface with a layer of photoresist;

masking and exposing said photoresist layer to expose regions corresponding to substantially parallel stripes;

developing said exposed regions of said photoresist layer;

removing the developed regions of said photoresist layer to expose regions of said layer of conductive material;

removing said exposed regions of said layer of conductive material; and removing the remaining photoresist layer.

3. The method in accordance with claim 1 wherein said step of removing said electrically insulating material from selected portions of said bus region and from said active region, and also removing portions of said transparent substrate in said active region in spaces between said electrically conductive regions comprises the sub-steps of:

coating said electrically insulating material with a layer of photoresist;

masking and exposing said photoresist layer to expose selected regions corresponding to said active region and to vias in said bus region;

developing said exposed regions of said photoresist layer;

removing the developed regions of said photoresist layer to expose said selected regions of said electrically insulating material;

etching said exposed selected regions of said electrically insulating material, and then continuing said etch to remove upper portions of said transparent substrate in said spaces in said active region; and removing the remaining regions of said photoresist layer.

4. The method in accordance with claim 1 wherein said steps of applying luminescent material on said conductive regions comprises electrophoretic deposition.

5. The method in accordance with claim 1 wherein said step of coating said surface with said electrically insulating material comprises the steps of:

spinning said substrate; and dispensing said material onto said surface to disperse said material over said surface.

6. The method in accordance with claim 1 wherein said step of coating said surface with said electrically insulating material comprises the step of spreading said material onto said surface.

7. The method in accordance with claim 1 wherein said step of depositing a conductive layer and forming therefrom a first bus in said bus region electrically connected to a first series of said conductive regions, a second bus in said bus region electrically connected to a second series of said conductive regions, and a third bus in said bus region electrically connected to a third series of said conductive regions comprises the sub-steps of:

depositing a second layer of electrically conductive material on said surface of said substrate;

coating said surface with a layer of photoresist;

masking and exposing said photoresist layer to expose regions corresponding to said first, second, and third buses;

developing said exposed regions of said photoresist layer;

removing the developed regions of said photoresist layer to expose regions of said second layer of conductive material;

removing said exposed regions of said second layer of conductive material; and removing the remaining photoresist layer.

* * * * *